United States Patent [19]
Park

[11] Patent Number: 5,930,670
[45] Date of Patent: Jul. 27, 1999

[54] METHOD OF FORMING A TUNGSTEN PLUG OF A SEMICONDUCTOR DEVICE

[75] Inventor: Sang Hoon Park, Ichon-Shi, Rep. of Korea

[73] Assignee: Hyundai Electronics Industries, Co., Ltd., Kyungki-do, Rep. of Korea

[21] Appl. No.: 08/747,794

[22] Filed: Nov. 14, 1996

[30] Foreign Application Priority Data

Nov. 15, 1995 [KR] Rep. of Korea ............ 95-41448
Dec. 11, 1995 [KR] Rep. of Korea ............ 95-48308

[51] Int. Cl.⁶ .................................................. H01L 21/28
[52] U.S. Cl. .......................... 438/629; 438/636; 438/648; 438/672; 438/906
[58] Field of Search .................................. 438/629, 636, 438/643, 644, 648, 656, 672, 906

[56] References Cited

U.S. PATENT DOCUMENTS

| | | | |
|---|---|---|---|
| 4,963,511 | 10/1990 | Smith | 437/192 |
| 5,164,330 | 11/1992 | Davis et al. | 438/648 |
| 5,260,232 | 11/1993 | Muroyama et al. | 438/629 |
| 5,312,775 | 5/1994 | Fujii et al. | 437/192 |
| 5,326,723 | 7/1994 | Petro et al. | 438/656 |
| 5,364,817 | 11/1994 | Lur et al. | 437/192 |
| 5,521,119 | 5/1996 | Chen et al. | 438/629 |
| 5,554,254 | 9/1996 | Huang et al. | 156/625.1 |
| 5,730,834 | 3/1998 | Gabriel | 156/643.1 |

FOREIGN PATENT DOCUMENTS

| | | |
|---|---|---|
| 0 596 364 A2 | 5/1994 | European Pat. Off. ...... 438/629 |
| 01196821 | 8/1989 | Japan . |
| 4-321224 | 11/1992 | Japan . |
| 05283363 | 10/1993 | Japan . |
| 05326722 | 12/1993 | Japan . |
| 06069155 | 3/1994 | Japan . |

OTHER PUBLICATIONS

Takayuki Ohba, "Chemical–Vapor–Deposited Tungsten for Vertical Wiring"; MRS Bulletin, pp. 46–52; Nov. 1995.

*Primary Examiner*—T. N. Quach
*Attorney, Agent, or Firm*—Scott C. Harris, Esq.

[57] ABSTRACT

The present invention relates to a method of forming a tungsten plug of a semiconductor device. After forming the tungsten plug in the contact hole, a tungsten residue existed in a portion except a contact hole is oxidized by oxidation and removed. The oxidation process is performed using a chemical mixture of hydrogen peroxide and ultrapure water. A metal wiring pattern including a reflection prevention layer can also be provided on the tungsten plug prior to the residue oxidation and removal.

19 Claims, 7 Drawing Sheets

METHOD OF FORMING A TUNGSTEN PLUG OF A SEMICONDUCTOR DEVICE

BACKGROUND OF INVENTION

1. Field of the invention

The present invention relates to a method of forming a semiconductor device and, more particularly, to a method of forming a tungsten plug of a semiconductor device that can remove the tungsten residue which remains in a portion other than the contact hole even after forming a tungsten plug in the contact hole.

2. Description of the prior art

Recently, as the semiconductor device becomes highly integrated, there is a trend that the size of the contact hole is reduced. As the size of the contact hole is reduced, metal is not well filled in the contact hole during the metal contact process, therefore, there occurs a problem that the contact resistance is increased. In general, aluminum, which has high conductivity, is widely used as a metal in the metal contact process. However, although aluminum has excellent conductivity, aluminum cannot satisfactorily fill the inside of the contact hole of small size due to its poor step-coverage characteristics. As a solution to solve such problem, first the inside of the contact hole is filled by a metal of excellent step-coverage characteristics, and then metal wiring is formed by an aluminum deposition and patterning process. Tungsten is mainly used to fill the contact hole because of its excellent step-coverage characteristics. Tungsten is a heat-resistant metal with a high melting point and has an advantage in that it has excellent thermal stability with silicon and has relatively low electrical specific resistivity.

Figure 1A:
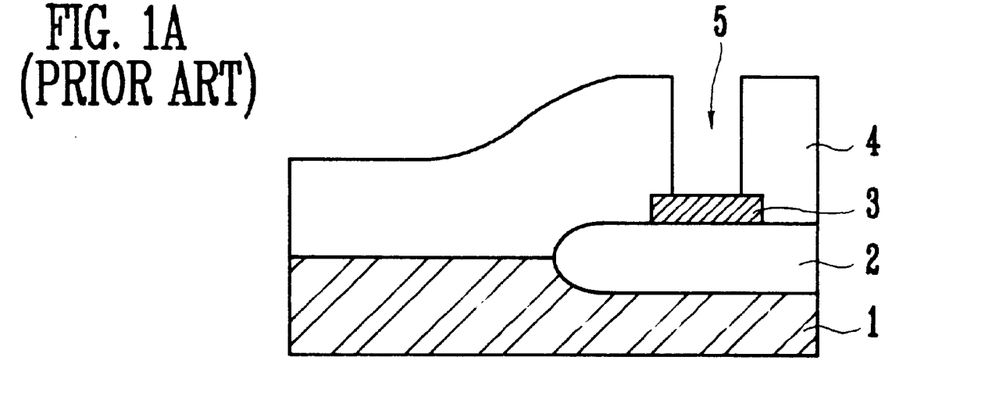
FIGS. 1A to 1C are sectional views of a device to illustrate a conventional method of forming a tungsten plug of a semiconductor device.
Figure 1B:
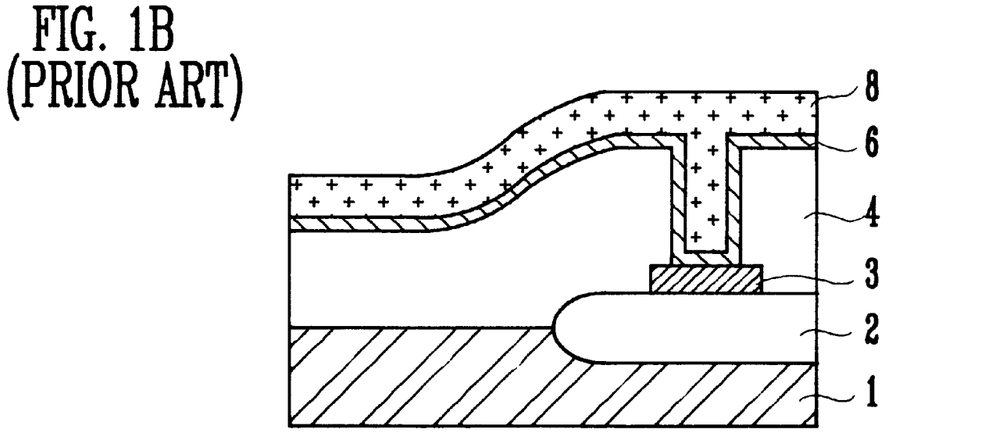
Figure 1C:
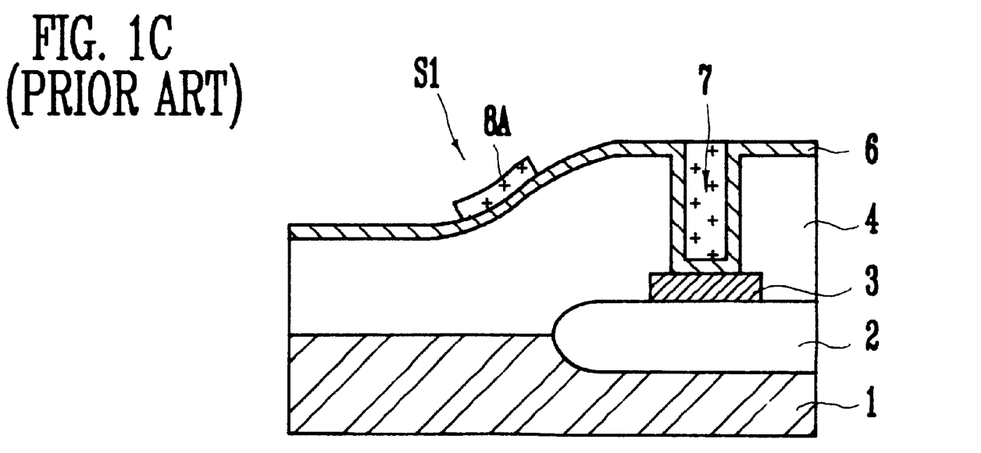

FIGS. 1A to 1C are sectional views of a device to illustrate a conventional method of forming a tungsten plug of a semiconductor device.

Referring to FIG. 1A, a field oxide layer 2 is formed on a portion of a silicon substrate 1, and a conductive layer 3 is formed on a portion of the field oxide layer 2. An insulating layer 4 is formed on the entire structure of the silicon substrate 1 including the field oxide layer 2 and the conductive layer 3. A selected portion of the insulating layer 4 is etched by a lithography process and etching process using a contact hole mask, therefore, a contact hole 5 for exposing the conductive layer 3 is formed.

In the above description, the surface of the insulating layer 4 is not flat due to the field oxide layer 2 and the conductive layer 3 formed on the silicon substrate 1.

Referring to FIG. 1B, a barrier metal layer 6 is thinly formed on the entire structure of the insulating layer 4 including the contact hole 5. A tungsten layer 8 is thickly formed on the barrier metal layer 6 including the contact hole 5 by a tungsten deposition process. The inside of the contact hole 5 is filled with tungsten by thickly forming the tungsten layer 8.

Referring to FIG. 1C, the tungsten layer 8 is removed by an anisotropic etching process until the barrier metal layer 6 is exposed, thus, a tungsten plug 7, which refers the tungsten layer 8 filling the inside of the contact hole 5, is formed. Although not shown in the drawing, after formation of the tungsten plug 7, a metal wiring connected to the tungsten plug 7 is formed by an aluminum deposition and patterning process.

In the above description, if the tungsten remains only in the contact hole 5 as the tungsten plug 7 formed by the anisotropic etching process, there occurs no problem. As described above, however, a portion of the tungsten layer 8 formed on the inclined portion S1 of the insulating layer 4 is not removed, therefore, tungsten residue 8A exists on the inclined portion S1 of the insulating layer 4.

If the metal wiring is formed when the tungsten residue 8A has not been removed, there can occur a problem in that the tungsten residue 8A will short the metal wiring, thereby degrading the reliability of the device.

SUMMARY OF THE INVENTION

Therefore, the object of the present invention is to provide a method of forming a tungsten plug, which can solve the above described problem by efficiently removing tungsten residue which can exist in a portion other than at the contact hole.

In order to achieve this object, the method of forming a tungsten plug of a semiconductor device according to the present invention comprises the steps of: forming an insulating layer on a silicon substrate and forming a contact hole by etching a selected portion of the insulating layer; sequentially forming a barrier metal layer and tungsten layer on the entire structure of the insulating layer including the contact hole; forming a tungsten plug in the contact hole by etching the tungsten layer until the barrier metal layer is exposed; performing an oxidation process to remove tungsten residue remaining on the barrier metal layer except at the contact hole, whereby the tungsten residue is changed into an oxide layer; and removing the oxide layer.

Another method of forming a tungsten plug of a semiconductor device to accomplish the above described object comprises the steps of: forming an insulating layer on a silicon substrate and forming a contact hole by etching a selected portion of the insulating layer; forming a tungsten layer on the insulating layer including the contact hole; etching a selected thickness of the tungsten layer to form a thin tungsten layer; sequentially forming a metal layer and a reflection prevention layer on the thin tungsten layer; sequentially etching a selected portion of the reflection prevention layer, the metal layer and thin tungsten layer, thereby forming a tungsten plug in the contact hole and forming a metal wiring connected to the tungsten plug; performing an oxidation process to remove tungsten residue existing on the insulating layer except at the contact hole, whereby an exposed surface of the top portion of the metal wiring and the tungsten residue are changed into oxide layers; and removing the oxide layers.

Still another method of forming a tungsten plug of a semiconductor device according to the present invention comprises the steps of: forming an insulating layer on the silicon substrate and forming a contact hole by etching a selected portion of the insulating layer; forming a tungsten layer on the insulating layer including the contact hole; etching the tungsten layer until the insulating layer is exposed, thereby forming a tungsten plug in the contact hole; sequentially forming a metal layer and a reflection prevention layer on the entire insulating layer including the tungsten plug; sequentially etching selected portion of the reflection prevention layer, whereby forming a metal wiring connected to the tungsten plug; performing an oxidation process to remove tungsten residue existing on the insulating layer except at the contact hole, whereby an exposed surface of the top portion of the metal wiring and the tungsten residue are changed into oxide layers; and removing the oxide layers.

BRIEF DESCRIPTION OF THE DRAWINGS

Other objects and advantages of the present invention will be understood by reading the detailed explanation of embodiments with reference to the accompanying drawings in which.

DETAILED DESCRIPTION OF THE INVENTION

The present invention will be described in detail below with reference to the accompanying drawings.

Figure 2A:
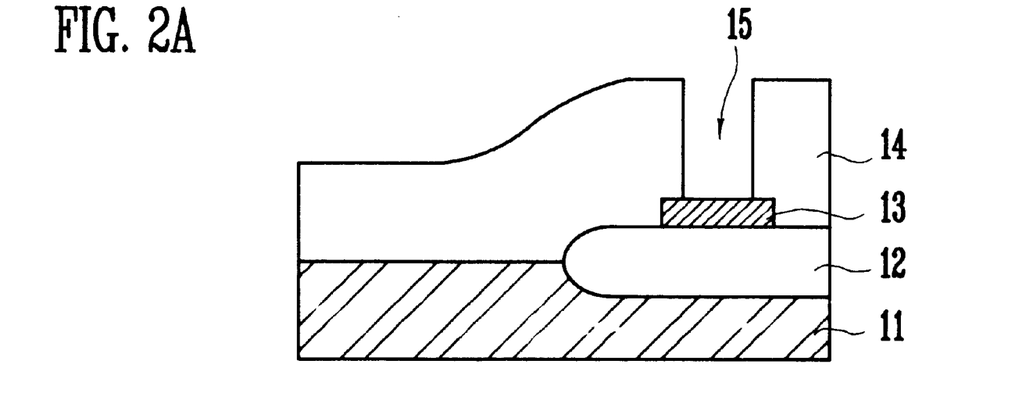
FIGS. 2A to 2E are sectional views of a device to illustrate a method of forming a tungsten plug of a semiconductor device according to a first embodiment of the present invention.

Referring to FIG. 2A, a field oxide layer 12 is formed on a portion of a silicon substrate 11, and a conductive layer 13 is formed on a portion of the field oxide layer 12. An insulating layer 14 is formed on the entire structure of the semiconductor substrate 11 including the field oxide layer 12 and the conductive layer 13. A selected portion of the insulating layer 14 is etched by a lithography process and an etching process using a contact hole mask, thus, a contact hole 15 for exposing the conductive layer 13 is formed.

In the above description, the surface of the insulating layer 14 is not flat due to the field oxide layer 12 and the conductive layer 13 formed on the silicon substrate 11.

Figure 2B:
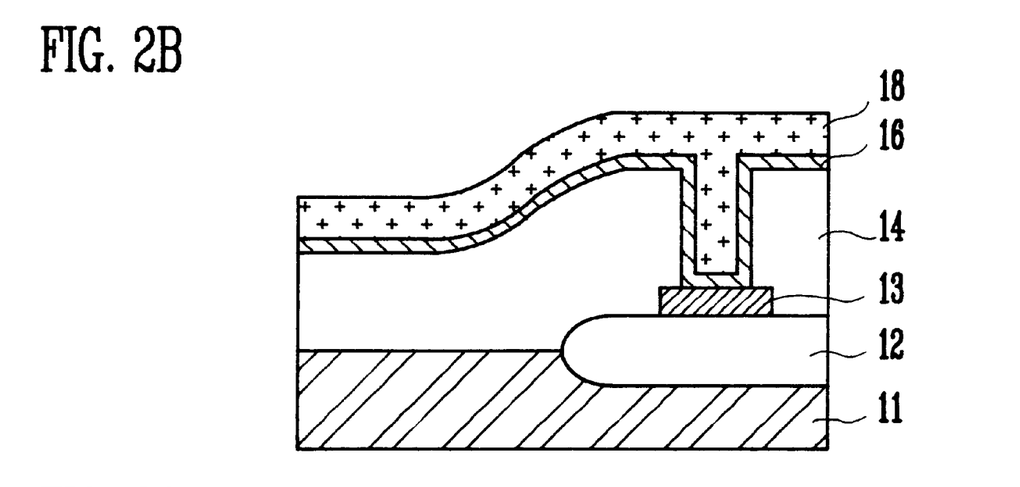

Referring to FIG. 2B, a barrier metal layer 16 is thinly formed on the entire structure of the insulating layer 14 including the contact hole 15. A tungsten layer 18 is then thickly formed on the barrier metal layer 16 including the contact hole 15 by a tungsten deposition process. As shown in FIG. 2B, the inside of the contact hole 15 is filled with tungsten by thickly forming the tungsten layer 18.

In the above description, the barrier metal layer 16 is formed by sequentially depositing titanium Ti and titanium nitride TiN. Titanium Ti is deposited to a thickness of 200 to 500 Å, and titanium nitride TiN is deposited to a thickness of 500 to 900 Å. The tungsten layer 18 is formed to a thickness of 5,000 to 8,000 Å by a deposition process using $SiH_4$ gas and $WF_6$ gas.

Figure 2C:
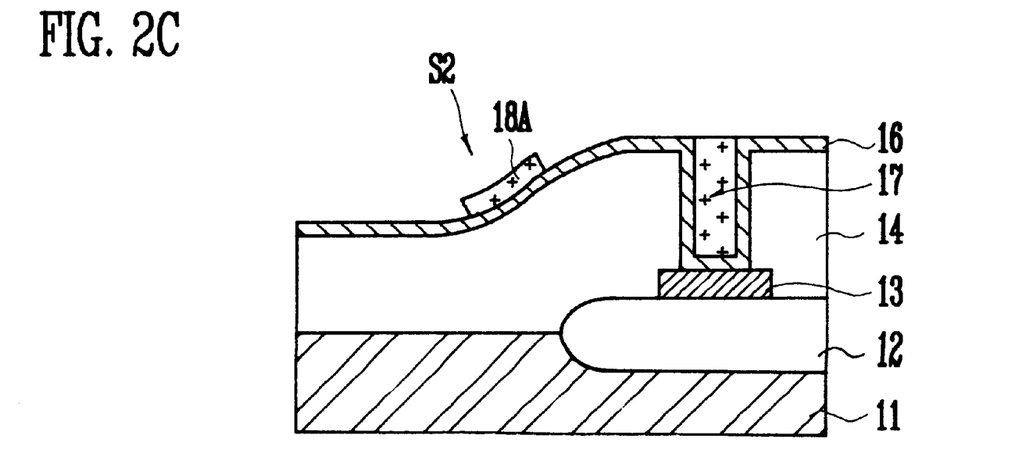

FIG. 2C shows that a tungsten layer 18 is etched by an anisotropic etching process until the barrier metal layer 16 is exposed and a tungsten plug 17 is formed in the contact hole 15. The tungsten filled into the inside of the contact hole 15 is referred to as the tungsten plug 17.

In the above description, if the tungsten plug 17 is formed in only the contact hole 15 by etching the tungsten layer 18, there occurs no problem. However, since an inclined portion S2 of the insulating layer 14 exists due to the fact that the surface of the insulating layer 14 is not flat, as described above, a portion of tungsten layer 18, which is deposited on the inclined portion S2 of the insulating layer 14, is not removed through the etching process. Therefore, a tungsten residue 18A exists on the inclined portion S2 of the insulating layer 14.

Figure 2D:
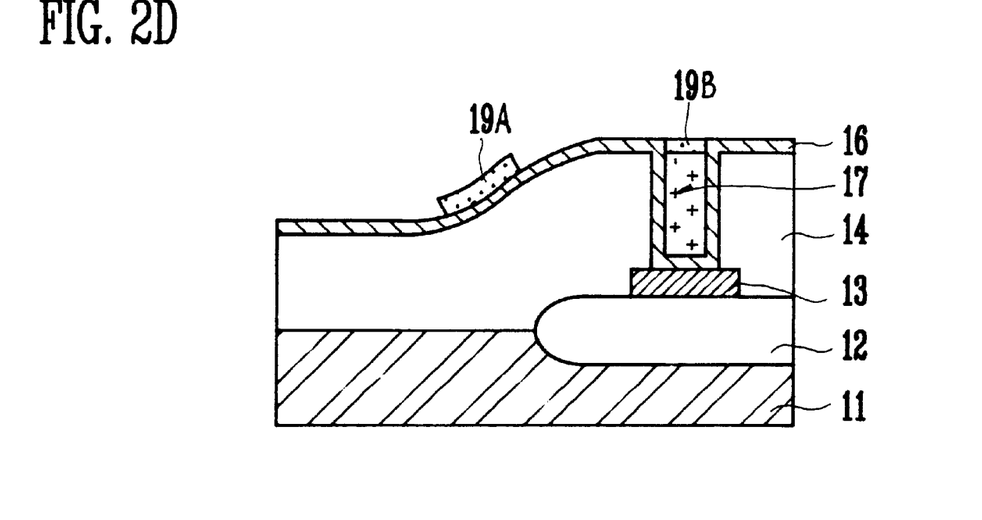

Referring to FIG. 2D, the tungsten residue 18A in FIG. 2C is changed to an oxide layer 19A by an oxidation process, and a cleaning process and drying process are then performed. The surface of the tungsten plug 17 is also changed to the oxide layer 19B during the oxidation process.

In the above description, a chemical solution, which is a mixture of 50% hydrogen peroxide ($H_2O_2$) and 50% ultra-pure water ($H_2O$), is used in the oxidation process, and a wafer is, on which the tungsten residue 18A shown in FIG. 2C exists, dipped in the chemical solution until the tungsten residue 18A is completely changed into the oxide layer 19A. The dipping is done for between 5 to 30 minutes. If the chemical solution is heated up to 50 to 100 degrees Celsius, the oxidation rate of the tungsten residue 18A can be increased. Ultra pure water is used in the cleaning process.

Figure 2E:
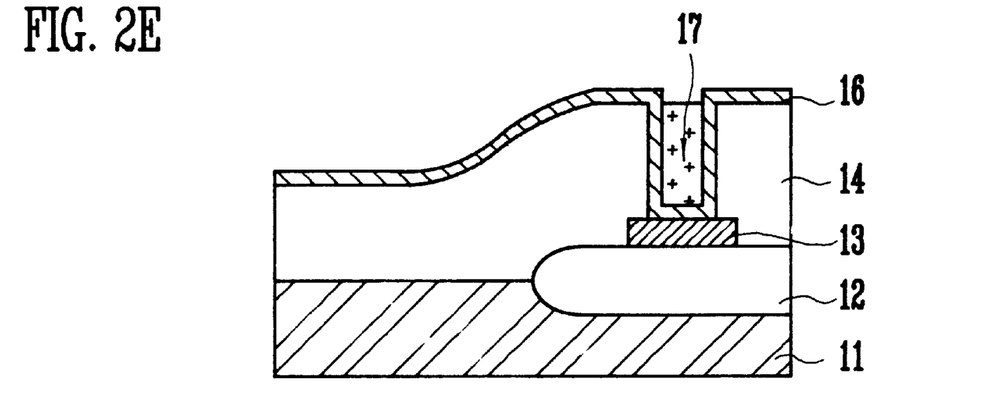

FIG. 2E shows that oxide layers 19A and 19B are removed by the etching process. In the etching process to the oxide layers 19A and 19B, $NF_3$ gas at a flow rate of 10 to 100 SCCM and Ar gas at a flow rate of 200 SCCM or less are used, the etching process is performed at a pressure of between 50 to 500 mTorr, at an electric power of between 200 to 700 Watt, and at a magnetic field of between 100 Gauss or less. FIGS. 3A to 3E are sectional views of a device to illustrate a method of forming the tungsten plug of the semiconductor device according to a second embodiment of the present invention.

Figure 3A:
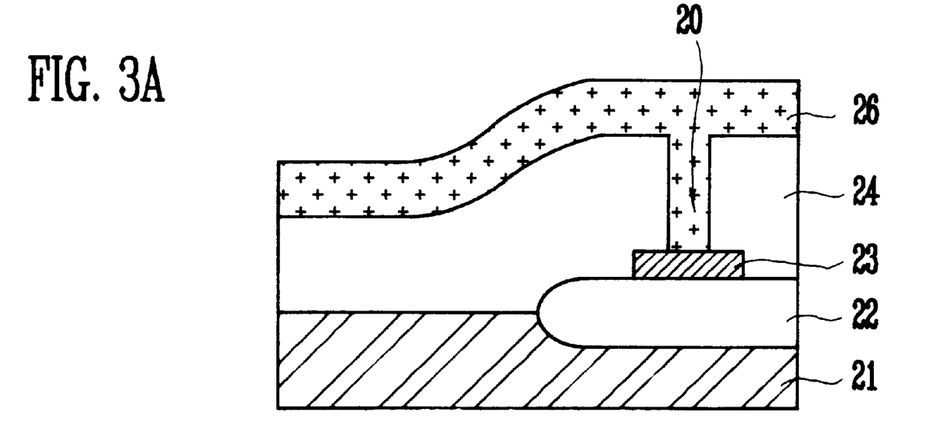
FIGS. 3A to 3E are sectional views of a device to illustrate a method of forming a tungsten plug of the semiconductor device according to a second embodiment of the present invention.

Referring to FIG. 3A, a field oxide layer 22 is formed on a portion of a silicon substrate 21, and a conductive layer 23 is formed on a portion of the field oxide layer 22. An insulating layer 24 is formed on the entire structure of the silicon substrate 21 including the field oxide layer 22 and the conductive layer 23. The surface of the insulating layer 24 is not flat due to the field oxide layer 22 and the conductive layer 23 formed on the silicon substrate 21. A selected portion of the insulating layer 24 is etched by a lithography process and an etching process using a contact hole mask, therefore, a contact hole 20 for exposing the conductive layer 23 is formed. A tungsten layer 26 is thickly formed on the insulating layer 24 including the contact hole 20 by the tungsten deposition process. The inside of the contact hole 20 is filled with tungsten by thickly forming the tungsten layer 26. The tungsten layer 26 is formed to a thickness of 5000 to 8000 Å by a deposition process using $SiH_4$ gas and $WF_4$ gas.

Figure 3B:
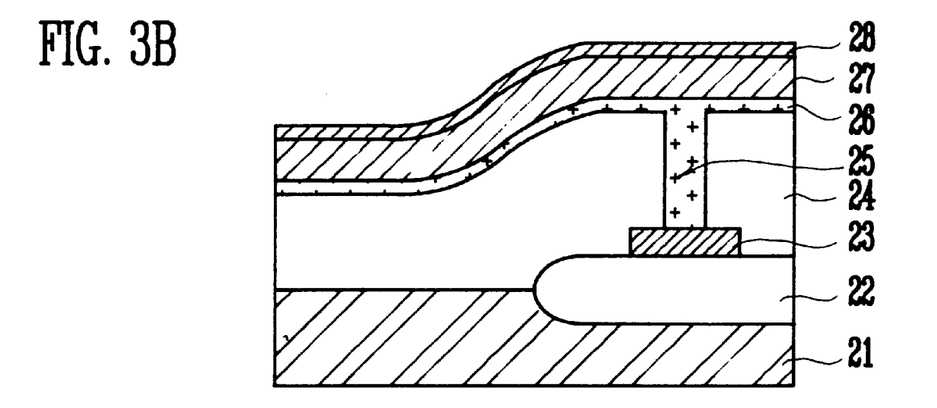

Referring to FIG. 3B, the thickly formed tungsten layer 26 is etched by an anisotropic etching process until the thickness of the tungsten layer 26 becomes 500 to 1000 Å, and a metal layer 27 and a reflection prevention layer 28 are sequentially formed on the thinned tungsten layer 26. The tungsten layer 26 filled into the inside of the contact hole 20 is referred to as a tungsten plug 25. Aluminum or aluminum alloy, which has a superior conductivity, is mainly used for the metal layer 27, and titanium nitride TiN is mainly used for the reflection prevention layer 28.

Figure 3C:
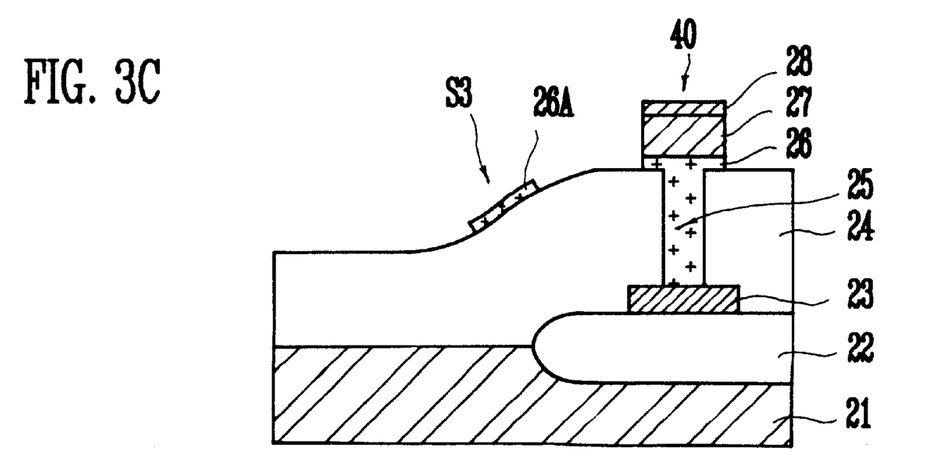

Referring to FIG. 3C, each selected portion of the reflection prevention layer 28, metal layer 27 and thin tungsten layer 26 is sequentially etched by the lithography process and etching process using a metal wiring mask, thus, a metal wiring 40 connected to the tungsten plug 25 is formed. During the etching process for forming the metal wiring 40, a portion of the tungsten layer 26, which is deposited on an inclined portion S3, is not removed due to the unevenness of the surface of the insulating layer 24, as described above, therefore, the tungsten residue 26A exists.

Figure 3D:
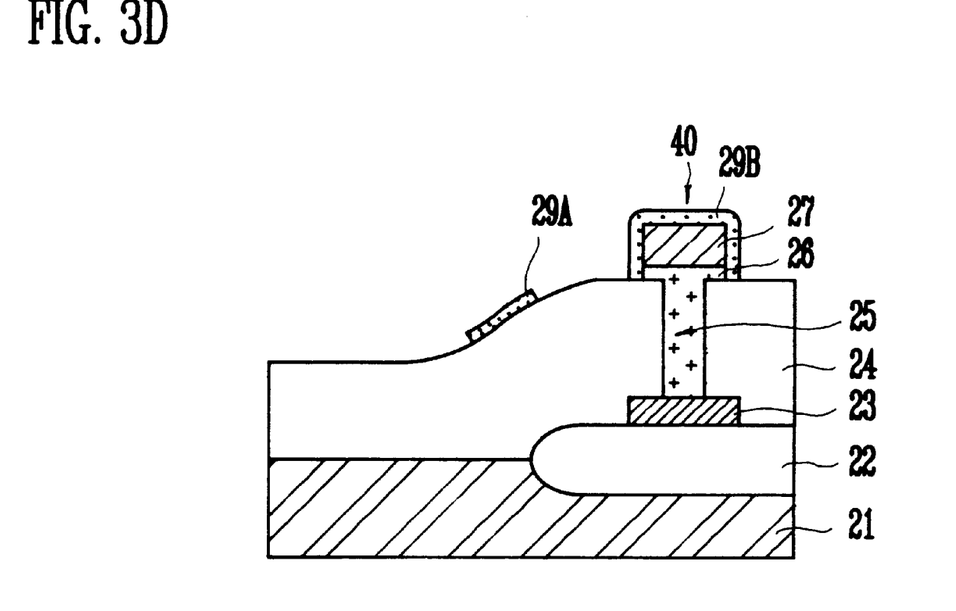

Referring to FIG. 3D, tungsten residue 26A in FIG. 3A is changed to a first oxide layer 29A by the oxidation process. The exposed surface of the metal wiring 40 is also changed into a second oxide layer 29B during the oxidation process.

In the above description, a chemical solution, which is a mixture of 50% hydrogen peroxide ($H_2O_2$) and 50% ultra-pure water ($H_2O$) is used in the oxidation process, and a wafer, on which the tungsten residue 26A exists, is dipped in the chemical solution until the tungsten residue 26A is completely changed to the first oxide layer 29A. The dipping is done for between 5 to 30 minutes. If the chemical solution is heated up to 50 to 100 degrees Celsius, the oxidation rate of the tungsten residue 26A can be increased.

Figure 3E:
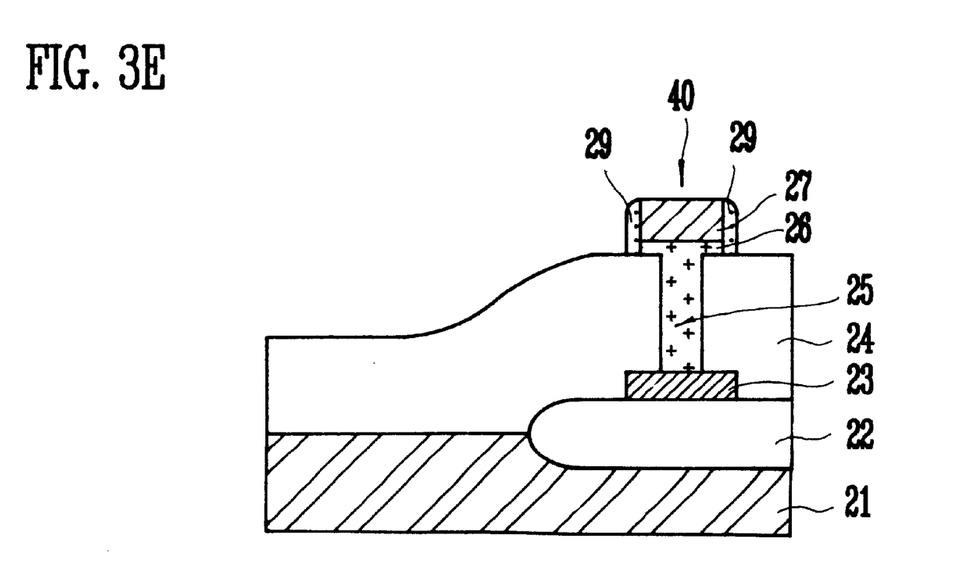

Referring to FIG. 3E, the first oxide layer 29A and the second oxide layer 29B formed on the top portion of the metal wiring 40 are removed by the anisotropic etching process using the $NF_3$ gas.

In the above description, the first oxide layer 29A and the second oxide layer 29B formed on the top portion of the metal wiring 40 are completely removed, the second oxide layer 29B formed at opposing sides of the metal wiring 40 remain, and become oxide spacers 29. These oxide spacers 29 help prevent erosion of the metal wiring 40.

FIGS. 4A to 4F are sectional views of the device to illustrate the method of forming the tungsten plug of the semiconductor device according to a third embodiment of the present invention.

Figure 4A:
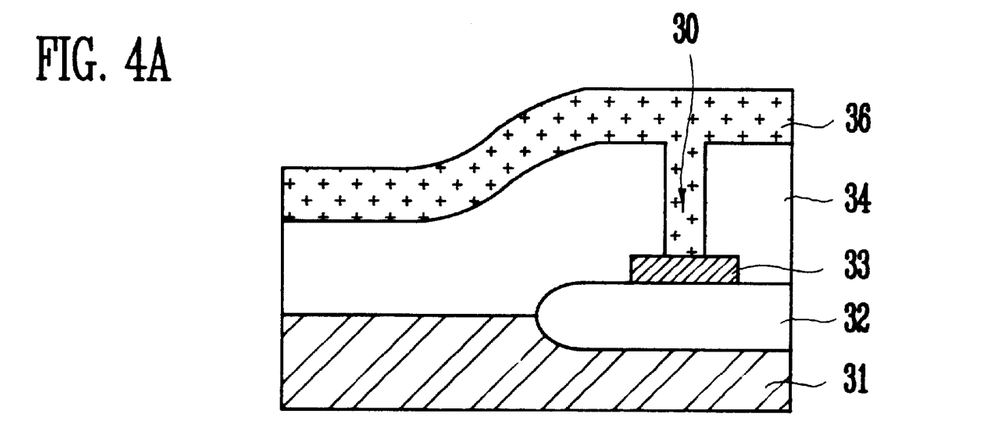
FIGS. 4A to 4F are sectional views of a device to illustrate a method of forming the tungsten plug of the semiconductor device according to a third embodiment of the present invention.

Referring to FIG. 4A, a field oxide layer 32 is formed on a portion of a semiconductor substrate 31, and a conductive layer 33 is formed on a portion of the field oxide layer 32. An insulating layer 34 is formed on the entire structure of the semiconductor substrate 31 including the field oxide layer 32 and conductive layer 33. The surface of the insulating layer 34 is not flat due to the field oxide layer 32 and conductive layer 33 formed on the semiconductor substrate 31. A portion of the insulating layer 34 is etched by the lithography process and etching process using a contact hole mask, thus a contact hole 30 for exposing the conductive layer 33 is formed.

A tungsten layer 36 is thickly formed on the insulating layer 34 including the contact hole 30 by the tungsten deposition process. The inside of the contact hole 30 is filled with tungsten by thickly forming the tungsten layer 36. The tungsten layer 36 is formed to a thickness of 5000 to 8000 Å by a deposition process using $SiH_4$ gas and $WF_6$ gas.

Figure 4B:
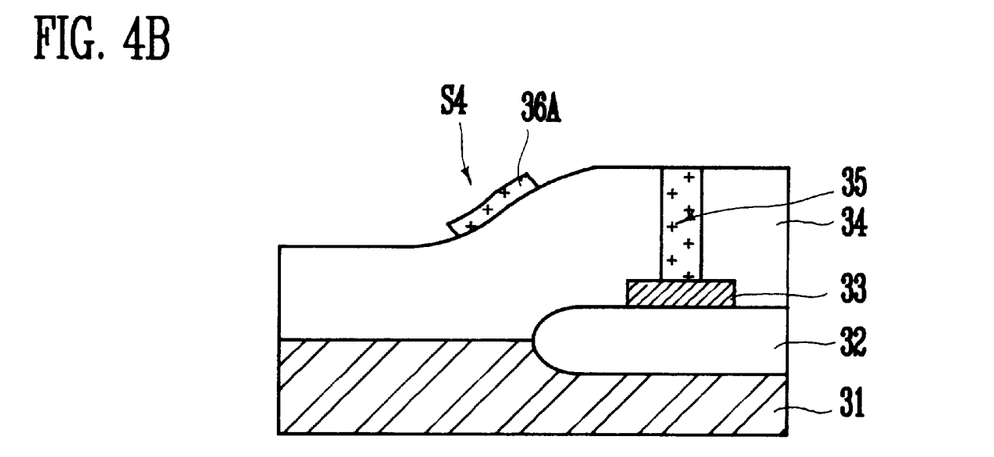

Referring to FIG. 4B, a tungsten plug 35 is formed inside the contact hole 30 by etching the tungsten layer 36 until the insulating layer 34 is exposed. The tungsten plug 35 refers to the tungsten layer which fills the inside of the contact hole 30.

In the above description, the gas used for the etching process to form the tungsten plug 35 is a mixture of $SF_6$, $O_2$ and Ar gas. If the tungsten plug 35 is formed by leaving the tungsten layer 35 in only the contact hole 30 by etching the tungsten layer 36, there occurs no problem. However, an inclined portion S4 of the insulating layer 34 exists due to the fact that the surface of the insulating layer 34 is not flat, as described above, therefore, the tungsten layer 36 is not completely removed, and tungsten residue 36A exists on the inclined portion S4.

Figure 4C:
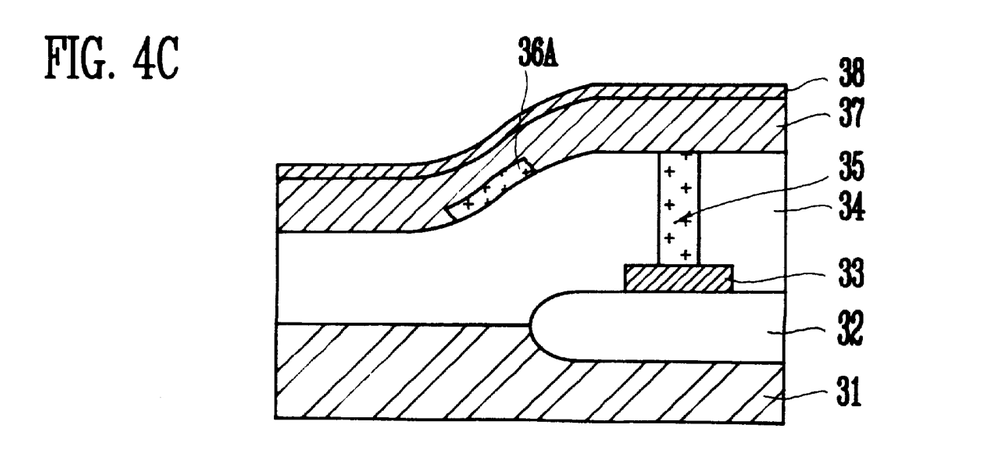

Referring to FIG. 4C, a metal layer 37 and reflection prevention layer 38 are sequentially formed on the insulating layer 34 including the tungsten residue 36A and tungsten plug 35. Aluminum or aluminum alloy having excellent conductivity is mainly used to form the metal layer 37, and titanium nitride TiN is mainly used to form the reflection prevention layer 38.

Figure 4D:
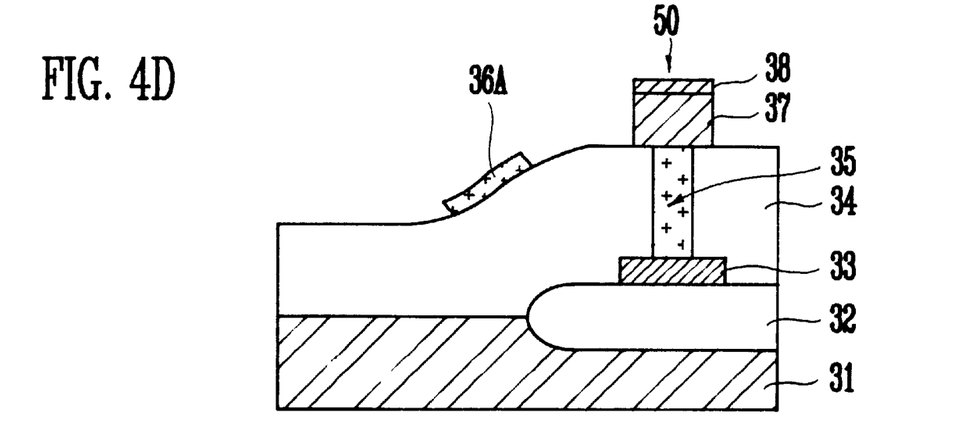

Referring to FIG. 4D, a metal wiring 50 connected to the tungsten plug 35 is formed by sequentially etching a selected portion of the reflection prevention layer 38 and metal layer 37 by the lithography process and etching process using a metal wiring mask. The tungsten residue 36A still exists even after the formation of the metal wiring 50.

Figure 4E:
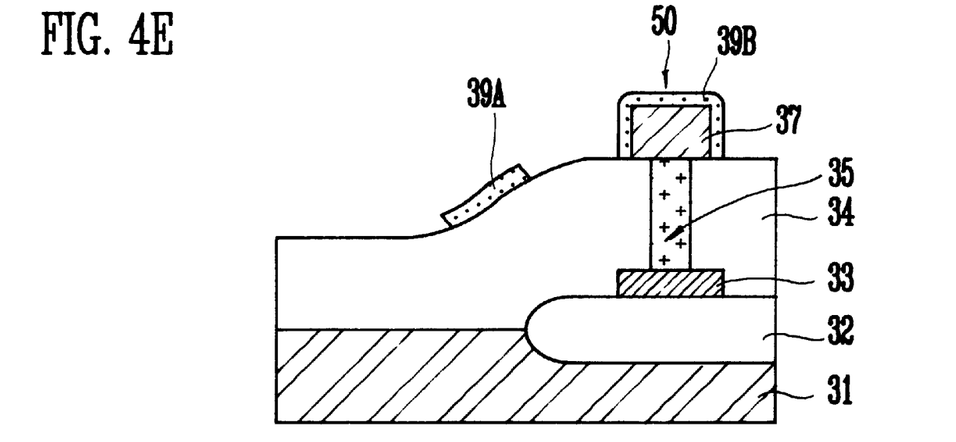

FIG. 4E shows a condition in which the tungsten residue 36A in FIG. 4D is changed to a first oxide layer 39A by the oxidation process. The exposed surface of the metal wiring 50 is also changed to a second oxide layer 39B during the oxidation process.

In the above description, a chemical solution, which is a mixture of 50% hydrogen peroxide ($H_2O_2$) and 50% ultra-pure water ($H_2O$), is used in the oxidation process, and a wafer, on which the tungsten residue 36A exists, is dipped in the chemical solution until the tungsten residue 36A is completely changed to the first oxide layer 39A. The dipping is done for between 5 to 30 minutes. If the chemical solution is heated up to 50 to 100 degrees Celsius, the oxidation rate of the tungsten residue 36A can be increased.

Figure 4F:
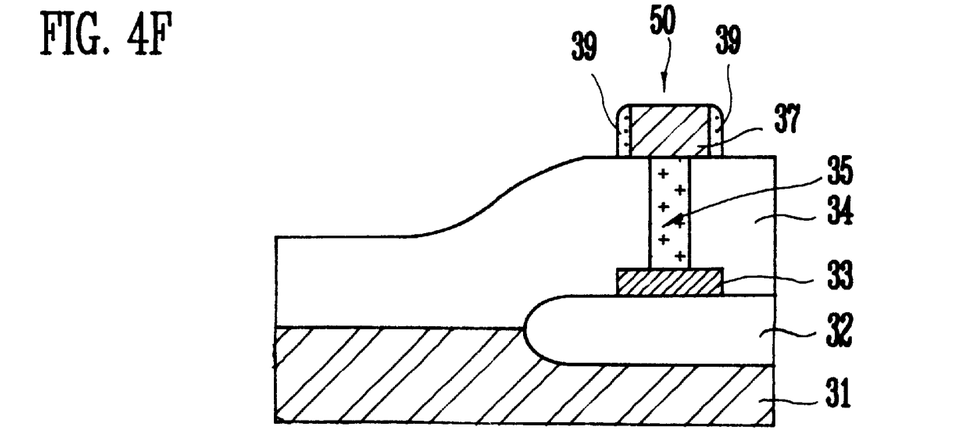

Referring to FIG. 4F, the first oxide layer 39A and the second oxide layer 39B formed on the top portion of the metal wiring 50 are removed by the anisotropic etching process using the $NF_3$ gas.

In the above description, the first oxide layer 39A and the second oxide layer 39B formed on the top portion of the metal wiring 50 are completely removed, the second oxide layer 39B formed at both sides of the metal wiring 50 remain and become oxide spacers 39. These oxide spacers 39 help prevent erosion of the metal wiring 50.

As described above, the method of forming the tungsten plug according to the present invention can efficiently remove the tungsten residue which exists on the inclined portion of the insulating layer at the time of forming the tungsten plug, thereby preventing the shortage of metal wiring and lowering the contact resistance.

Many modifications and variations may be made in the techniques and structures described and illustrated herein without departing from the spirit and scope of the present invention. Accordingly, it should be understood that the techniques and structures described and illustrated herein are illustrative only and are not to be considered as limitations upon the scope of the present invention.

What is claimed is:

1. A method of forming a tungsten plug of a semiconductor device comprising the steps of:

forming an insulating layer on a silicon substrate and a forming a contact hold by etching a selected portion of said insulation layer;

sequentially forming a barrier metal layer and a tungsten layer on the entire structure of said insulating layer including said contact hole;

forming a tungsten plug in said contact hole by etching said tungsten layer until said barrier layer is exposed;

performing an oxidation process using a chemical mixture of hydrogen peroxide and ultrapure water to remove tungsten residue remaining on said barrier metal layer except at said contact hole, whereby said tungsten residue is changed into an oxide layer; and removing said oxide layer.

2. The method of claim 1, wherein said hydrogen peroxide and ultrapure water are mixed at the ratio of 1:1.

3. The method of claim 1, wherein said chemical mixture is at the temperature of between 50 to 100 degrees Celsius.

4. A method of forming a tungsten plug of a semiconductor device comprising the steps of:

forming a contact hole on a silicon substrate;

forming a tungsten layer on the entire structure including said contact hole;

forming a tungsten plug in said contact hole by etching said tungsten layer;

performing an oxidation process using a chemical mixture of hydrogen peroxide and ultrapure water to remove tungsten residue existing on any portion except at said contact hole, whereby said tungsten residue is changed into an oxide layer; and removing said oxide layer.

5. The method of claim 4, wherein said hydrogen peroxide and ultrapure water are mixed at the ratio of 1:1.

6. The method of claim 4, wherein said chemical mixture is at the temperature of between 50 to 100 degrees Celsius.

7. A method of forming a tungsten plug of a semiconductor device comprising the steps of:

forming an insulating layer on the silicon substrate and a forming a contact hole by etching a selected portion of said insulating layer;

forming a tungsten layer on said insulating layer including said contact hole;

etching a selected thickness of said tungsten layer to form a thin tungsten layer;

sequentially forming a metal layer and a reflection prevention layer on said thin tungsten layer;

sequentially etching selected portions of said reflection prevention layer, said metal layer and thin tungsten layer, thereby forming a tungsten plug in said contact hole and forming a metal wiring connected to said tungsten plug;

performing an oxidation process to remove tungsten residue existing on said insulating layer except at said contact hole, whereby the exposed surface of the top portion of said metal wiring and said tungsten residue are changed into oxide layers; and removing said oxide layers.

8. The method of claim 7, wherein the thickness of said tungsten layer is 5000 to 8000 Å.

9. The method of claim 7, wherein the thickness of said thin tungsten layer is 500 to 1000 Å.

10. The method of claim 7, wherein said oxidation process is performed by a chemical mixture of hydrogen peroxide and ultrapure water.

11. The method of claim 10, wherein said hydrogen peroxide and ultrapure water are mixed at the ratio of 1:1.

12. A method of claim 10, wherein said chemical mixture is at a temperature between 50 to 100 degrees Celsius.

13. The method of claim 7, wherein said oxide layers are removed by an anisotropic etching process using $NF_3$ gas.

14. A method of forming a tungsten plug of a semiconductor device comprising the steps of:

forming an insulating layer on the semiconductor substrate and forming a contact hole by etching a selected portion of said insulating layer;

forming a tungsten layer on said insulating layer including said contact hole;

etching said tungsten layer until said insulating layer is exposed, thereby forming a tungsten plug in said contact hole;

sequentially forming a metal layer and a reflection prevention layer on said entire insulating layer including said tungsten plug;

sequentially etching selected portions of said reflection prevention layer, thereby forming a metal wiring connected to said tungsten plug;

performing an oxidation process to remove tungsten residue existing on said insulating layer except at said contact hole, whereby the exposed surface of the top portion of said metal wiring and said tungsten residue are changed into oxide layers; and removing said oxide layers.

15. The method of claim 14, wherein said tungsten layer is etched by an anisotropic etching process using a mixture of the gases of $SF_6$, $O_2$ and Ar.

16. The method of claim 14, wherein said oxidation process is performed by a chemical mixture of hydrogen peroxide and ultrapure water.

17. The method of claim 16, wherein said hydrogen peroxide and ultrapure water are mixed at the ratio of 1:1.

18. The method of claim 16, wherein said chemical mixture is at a temperature between 50 to 100 degrees Celsius.

19. The method of claim 14, wherein said oxide layers are removed by an anisotropic etching process using $NF_3$ gas.

* * * * *